United States Patent
Yoo (10) Patent No.: US 9,001,586 B1
(45) Date of Patent: Apr. 7, 2015

(54) SEMICONDUCTOR MEMORY DEVICE CAPABLE OF PREVENTING DEGRADATION OF MEMORY CELLS AND METHOD FOR ERASING THE SAME

(71) Applicant: SK Hynix Inc., Gyeonggi-do (JP)

(72) Inventor: Deung Kak Yoo, Gyeonggi-do (JP)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/219,811

(22) Filed: Mar. 19, 2014

(30) Foreign Application Priority Data

Oct. 31, 2013 (KR) .................. 10-2013-0131082

(51) Int. Cl.
*G11C 16/16* (2006.01)
*G11C 8/10* (2006.01)

(52) U.S. Cl.
CPC ........................................ *G11C 8/10* (2013.01)

(58) Field of Classification Search
USPC ............ 365/185.03, 185.05, 185.17, 185.12, 365/185.13, 185.11, 185.23, 185.27, 185.29
See application file for complete search history.

(56) References Cited

U.S. PATENT DOCUMENTS

| | | | |
|---|---|---|---|
| 6,620,682 B1* | 9/2003 | Lee et al. | 438/257 |
| 7,161,842 B2* | 1/2007 | Park | 365/185.33 |
| 2007/0047327 A1* | 3/2007 | Goda et al. | 365/185.29 |

FOREIGN PATENT DOCUMENTS

| | | |
|---|---|---|
| KR | 1020110007025 | 1/2011 |
| KR | 101177215 | 8/2012 |
| KR | 1020130022228 | 3/2013 |

* cited by examiner

*Primary Examiner* — Andrew Q Tran
(74) *Attorney, Agent, or Firm* — IP & T Group LLP (57) ABSTRACT

A semiconductor memory device according to an embodiment of the present invention may include a memory cell array having a plurality of memory cells, a pass transistor group having normal pass transistors coupled between global word lines and local word lines to which the plurality of memory cells are coupled, and an address decoder coupled to the global word lines and a block word line to which gates of the normal pass transistors are coupled in common, wherein the address decoder gradually increases a voltage, obtained by subtracting a voltage of the global word lines from a voltage of the block word line, when an erase voltage is provided to a channel of the plurality of memory cells.

19 Claims, 11 Drawing Sheets

SEMICONDUCTOR MEMORY DEVICE CAPABLE OF PREVENTING DEGRADATION OF MEMORY CELLS AND METHOD FOR ERASING THE SAME

CROSS-REFERENCE TO RELATED APPLICATION

The present application claims priority to Korean patent application number 10-2013-0131082, filed on Oct. 31, 2013, the entire disclosure of which is herein incorporated in its entirety by reference.

BACKGROUND

1. Field of Invention

Various exemplary embodiments of the present invention relate generally to an electronic device, and more particularly, to a semiconductor memory device and a method for erasing same.

2. Description of Related Art

A semiconductor memory device is a storage device that is realized using a semiconductor made from, for example, silicon (Si), germanium (Ge), gallium arsenide (GaAs) or indium phosphide (InP). Semiconductor memory devices may be classified into volatile memory devices and non-volatile memory devices.

Volatile memory devices are unable to retain stored data when the power is off. Examples of the volatile memory devices may include Static Random Access Memory (SRAM), Dynamic RAM (DRAM) and Synchronous DRAM (SDRAM). Non-volatile memory devices can retain the stored data regardless of power on/off conditions. Examples of the non-volatile memory include Read Only Memory (ROM), Mask ROM (MROM), Programmable ROM (PROM), Erasable Programmable ROM (EPROM), Electrically Erasable and Programmable ROM (EEPROM), flash memory, Phase-change RAM (PRAM), Magnetic RAM (MRAM), Resistive RAM (RRAM) and Ferroelectric RAM (FRAM). Flash memories may be classified into NOR-type memories and NAND-type memories.

Recently, to improve a degree of integration of a semiconductor memory device, research has been conducted on a semiconductor memory device having a three-dimensional array structure. In an erase operation of this semiconductor memory device, a high electric field may be produced between a channel of a memory cell and a word line. When the erase operation is repeated, the memory cell may be gradually degraded due to the high electric field.

SUMMARY

Exemplary embodiments of the present invention are directed to a semiconductor memory device preventing degradation of a memory cell and a method for erasing same.

A semiconductor memory device according to an embodiment of the present invention may include a memory cell array having a plurality of memory cells, a pass transistor group having normal pass transistors coupled between global word lines and local word lines to which the plurality of memory cells are coupled, and an address decoder coupled to the global word lines and a block word line to which gates of the normal pass transistors are coupled in common, wherein the address decoder gradually increases a voltage, obtained by subtracting a voltage of the global word lines from a voltage of the block word line, when an erase voltage is provided to a channel of the plurality of memory cells.

According to an embodiment of the present invention an erasing method of a semiconductor memory device having a plurality of memory cells and normal pass transistors coupled between local word lines, coupled to the plurality of memory cells, and global word lines may include providing an erase voltage to a channel of the plurality of memory cells, and when the erase voltage is provided gradually increasing a voltage obtained by subtracting a voltage of the global word lines from a voltage of a block word line connected in common to gates of the normal pass transistors, and applying a ground voltage to the local word lines through the global word lines.

A semiconductor memory device according to yet another embodiment of the present invention may include a memory cell array having a plurality of memory cells stacked over a substrate, local word lines coupled to the plurality of memory cells, and an address decoder coupled to the local word lines, wherein the address decoder floats the local word lines to increase a voltage of the local word lines by an erase voltage provided to a channel of the plurality of memory cells, and then gradually discharges the voltage of the local word lines.

DETAILED DESCRIPTION

Hereinafter, various exemplary embodiments of the present invention will be described in detail with reference to the accompanying drawings. The figures are provided to enable those of ordinary skill in the art to make and use the present invention according to the exemplary embodiments of the present invention. Throughout the disclosure, reference numerals correspond directly to the like numbered parts in the various figures and embodiments of the present invention.

Furthermore, 'connected/coupled' represents that one component is directly coupled to another component or indirectly coupled through another component. In this specification, a singular form may include a plural form as long as it is not specifically mentioned in a sentence. Furthermore, "include/comprise" or "including/comprising" used in the specification represents that one or more components, steps, operations, and elements exists or are added.

Figure 1:
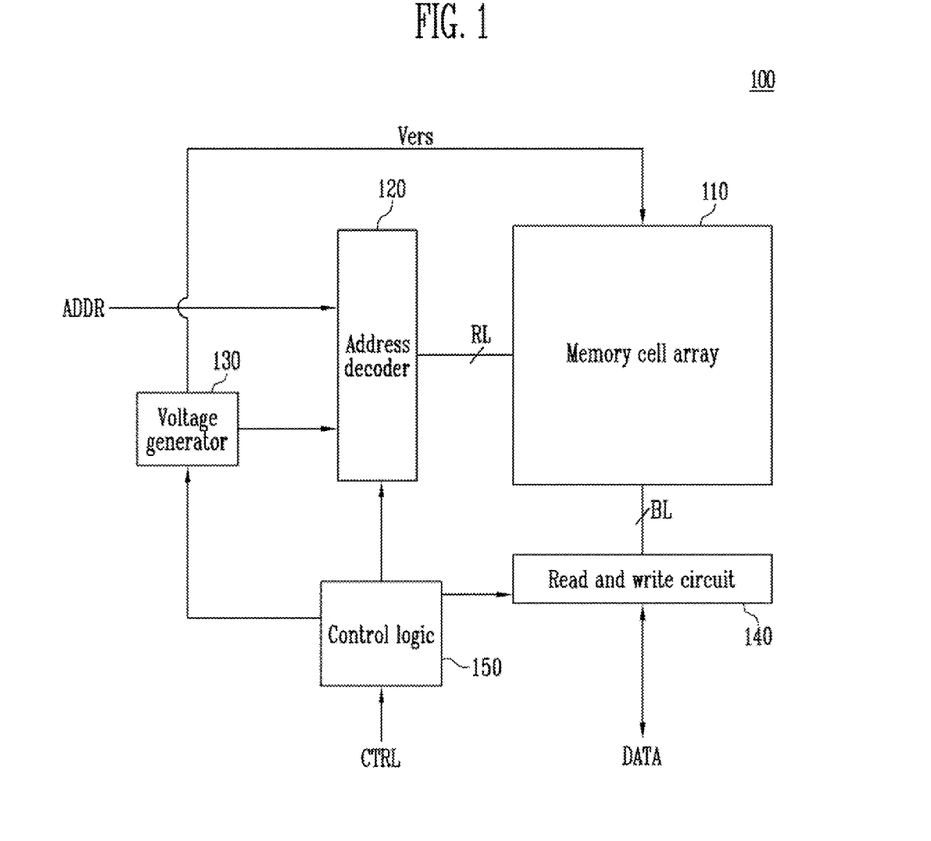
FIG. 1 is diagram illustrating a semiconductor memory device.

FIG. 1 is a block diagram illustrating a semiconductor memory device 100.

Referring to FIG. 1, the semiconductor memory device 100 may include a memory cell array 110, an address decoder 120, a voltage generator 130, a read and write circuit 140, and a control logic 150.

The memory cell array 110 may be coupled to the address decoder 120 through row lines RL. The memory cell array 110 may be coupled to the read and write circuit 140 through bit lines BL.

The memory cell array 110 may include a plurality of memory blocks. Each of the plurality of memory blocks may include a plurality of cell strings. Each of the plurality of cell strings may include a plurality of memory cells that are stacked over a substrate. According to an embodiment, the plurality of memory cells may be non-volatile memory cells. According to an embodiment, each of the plurality of memory cells may be defined as a single-level cell or a multi-level cell. The memory cell array 110 will be described below in detail with reference to FIGS. 2 to 4.

The address decoder 120 may be coupled to the memory cell array 110 through the row lines RL. The row lines RL may include local drain selection lines, local word lines, a local source selection line, and a common source line. According to an embodiment, the row lines RL may further include a local pipe selection line.

The address decoder 120 may be suitable for driving the row lines RL in response to the control logic 150. The address decoder 120 may receive addresses ADDR from exterior or an input/output buffer (not illustrated) in the semiconductor memory device 100.

An erase operation of the semiconductor memory device 100 may be performed in units of memory blocks. That is, the addresses ADDR may include a block address during an erase operation. The address decoder 120 may be suitable for decoding the block address. The address decoder 120 may select at least one memory block in response to the decoded block address when an erase voltage Vers is applied to a channel of the memory cells of the memory cell array 110. Data in the memory cells included in the selected memory block may be erased by controlling the row lines RL coupled to the selected memory block.

The address decoder 120 may include a block decoder, a row decoder, and an address buffer.

The voltage generator 130 may be suitable for generating a plurality of voltages by using an external voltage provided to the semiconductor memory device 100. The voltage generator 130 may be controlled by the control logic 150.

According to an embodiment of the present invention, the voltage generator 130 may include a circuit that generates a power voltage by regulating an external voltage. For example, the voltage generator 130 may include a plurality of pumping capacitors and generate a plurality of voltages by selectively activating the plurality of pumping capacitors. The erase voltage Vers, among the plurality of voltages, may be applied to a bulk region of the memory cell array 110 and transferred to a channel of the memory cells of the selected memory block. Other voltages may be transferred to the address decoder 120.

The read and write circuit 140 may be coupled to the memory cell array 110 through the bit lines BL. The read and write circuit 140 may be controlled by the control logic 150.

The read and write circuit 140 may float the bit lines BL during an erase operation. During a program operation and a read operation, the read and write circuit 140 may communicate the data DATA with exterior or the input/output buffer (not illustrated) of the semiconductor memory device 100.

According to an exemplary embodiment, the read and write circuit 140 may include page buffers (or page registers) and a column selection circuit.

The control logic 150 may be coupled to the address decoder 120, the voltage generator 130 and the read and write circuit 140. The control logic 150 may receive a control signal CTRL from exterior or the input/output buffer (not illustrated) of the semiconductor memory device 100. The control logic 150 may control the general operation of the semiconductor memory device 100 in response to the control signal CTRL.

The semiconductor memory device 100 may further include an input/output buffer (not illustrated). The input/output buffer may receive the control signal CTRL and the addresses ADDR and transfer the control signal CTRL and the addresses ADDR to the control logic 150 and the address decoder 120, respectively. Additionally, the input/output buffer may be suitable for transferring the data DATA, which is input from exterior, to the read and write circuit 140 and transferring the data DATA, which is from the read and write circuit 140, to exterior.

According to an exemplary embodiment of the present invention, the semiconductor memory device 100 may be a flash memory device.

Figure 2:
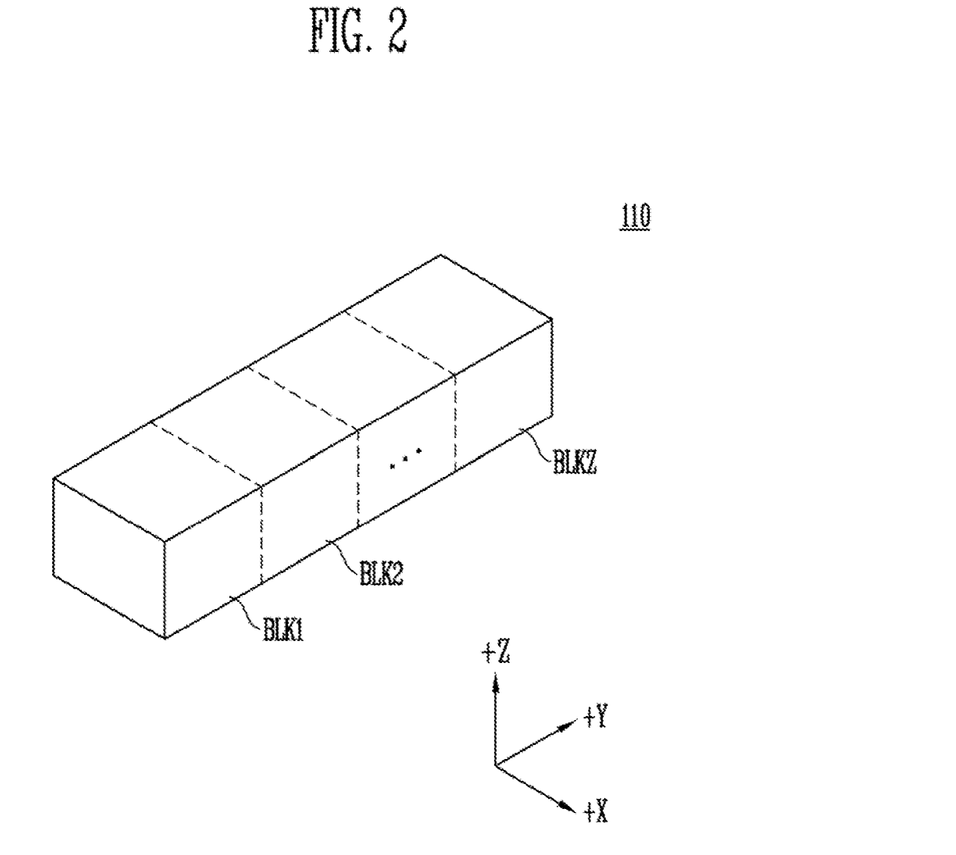
FIG. 2 is a block diagram illustrating an embodiment of a memory cell array shown in FIG. 1.

FIG. 2 is a block diagram illustrating an embodiment of the memory cell array 110 shown in FIG. 1.

Referring to FIG. 2, the memory cell array 110 may include a plurality of memory blocks BLK1 to BLKz. Each of the memory blocks BLK1 to BLKz may include a three-dimensional configuration. Each of the memory blocks BLK1 to BLKz may include a plurality of memory cells stacked over the substrate. The memory cells may be arranged in a +X direction, a +Y direction, and a +Z direction. The configuration of each memory block is described below with reference to FIGS. 3 and 4.

Figure 3:
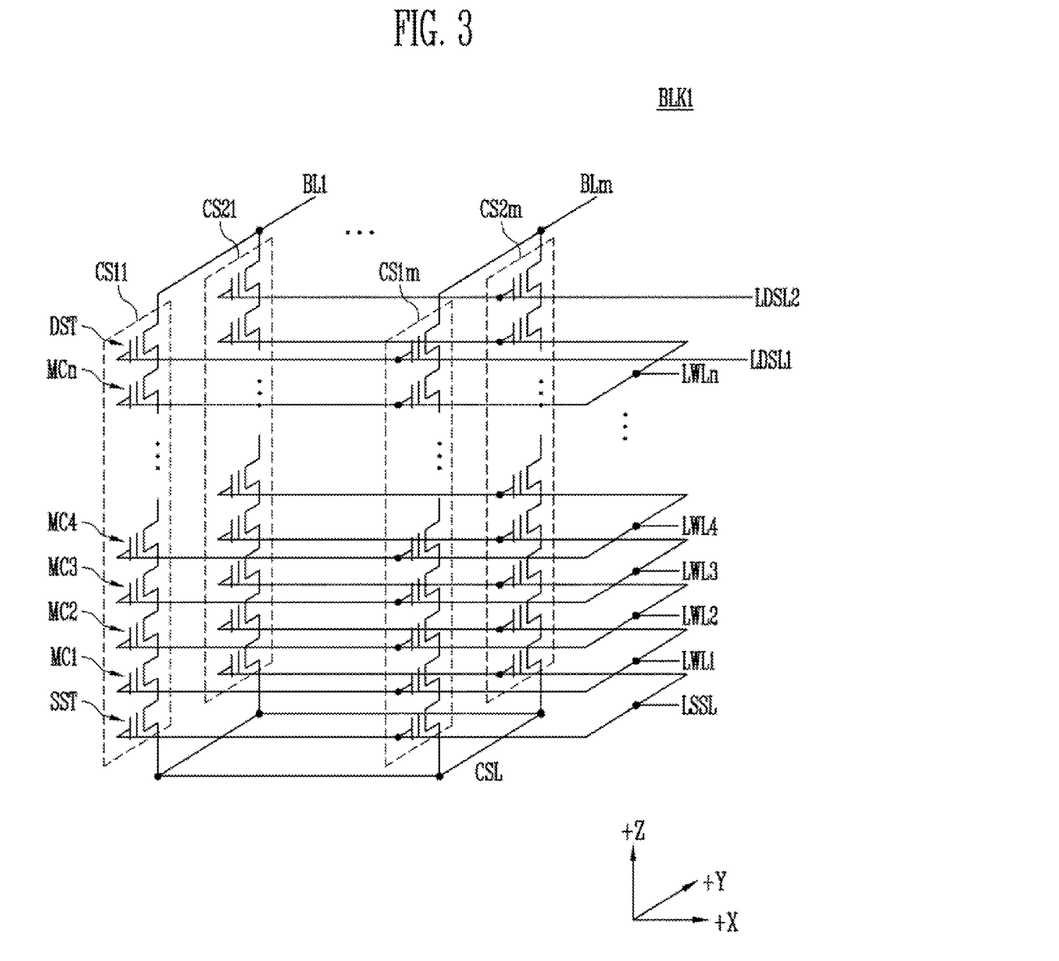
FIG. 3 is a circuit diagram illustrating one of memory blocks shown in FIG. 2.

FIG. 3 is a circuit diagram illustrating one of the memory blocks BLK1 to BLKz shown in FIG. 2, for example, first memory block BLK1.

Referring to FIG. 3, the first memory block BLK1 may include a plurality of cell strings CS11 to CS1m and CS21 to CS2m. Each of the cell strings CS11 to CS1m and CS21 to CS2m may extend in the +Z direction. Each of the cell strings CS11 to CS1m and CS21 to CS2m may include a source selection transistor SST, first to n-th memory cells MC1 to MCn and a drain selection transistor DST that are stacked in the +Z direction.

The source selection transistor SST of each cell string may have a first height. A source of the source selection transistor SST of each cell string may be coupled to the common source line CSL, and a gate thereof may be coupled to a local source selection line LSSL.

The first to n-th memory cells MC1 to MCn may have second to n+1-th heights, respectively. Memory cells having the same height may be coupled to the same word line. A gate of a first memory cell MC1 of each cell string may be coupled to a first local word line LWL1. A gate of the second memory cell MC2 of each cell string may be coupled to a second local word line LWL2. A gate of a third memory cell MC3 of each cell string may be coupled to a third local word line LWL3. A gate of a fourth memory cell MC4 of each cell string may be coupled to a fourth local word line LWL4. A gate of an n-th memory cell MCn of each cell string may be coupled to an n-th local word line LWLn.

The drain selection transistor DST of each cell string may have an n+2-th height. The drain selection transistors DST of the cell strings arranged in the same row, i.e., in the +X direction, may be coupled to the same local drain selection line. A gate of the drain selection transistor DST, included in each of the cell strings CS11 to CS1m, may be coupled to a first local drain selection line LDSL1. A gate of the drain selection transistor DST, included in each of the cell strings CS21 to CS2m, may be coupled to a second local drain selection line LDSL2.

The drain selection transistors DST of the cell strings arranged in the same row, i.e., in the +Y direction may be coupled to the same bit line. The drain selection transistors DST, included in the cell strings CS11 and CS21, may be coupled to a first bit line BL1. The drain selection transistors DST, included in the cell strings CS1m to CS2m, may be coupled to an m-th bit line BLm.

According to an embodiment of the present invention, though not illustrated in FIG. 3, at least one dummy memory cell may be further provided between the drain selection transistor DST and the first to n-th memory cells MC1 to MCn.

At least one dummy memory cell may be further included between the source selection transistor SST and the first to n-th memory cells MC1 to MCn. For other various purposes, a dummy memory cell may be arranged between memory cells or adjacent to the memory cells.

Figure 4:
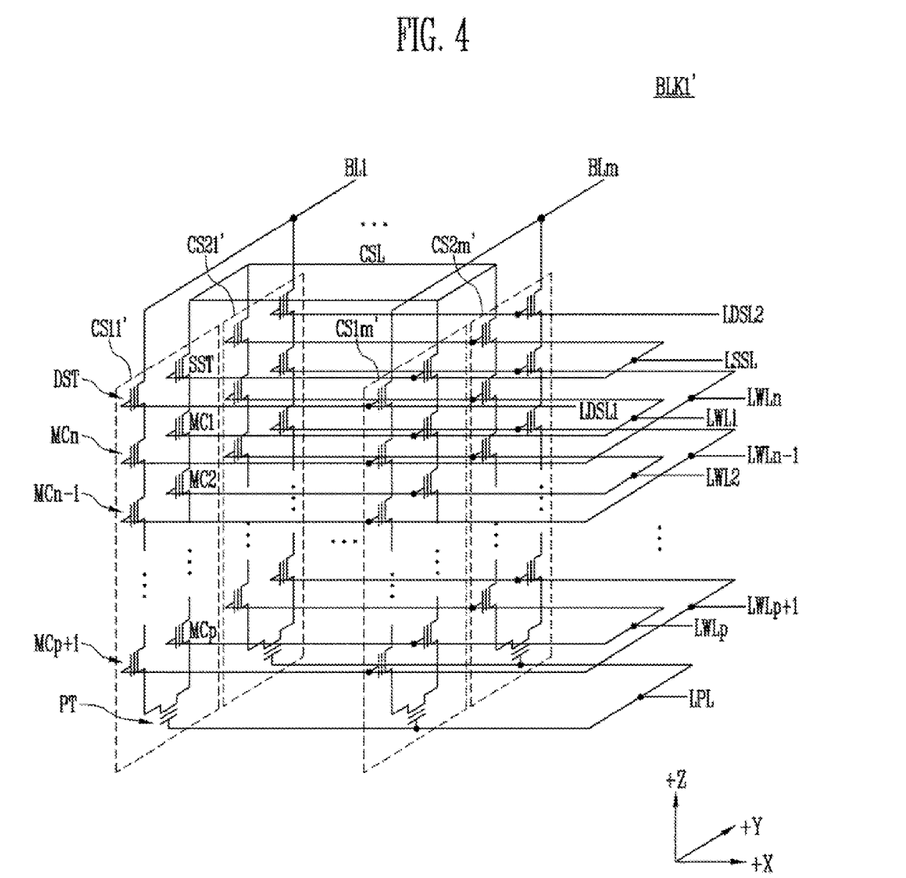
FIG. 4 is a circuit diagram illustrating another embodiment of one of the memory blocks shown in FIG. 2.

FIG. 4 is a circuit diagram illustrating another embodiment (BLK1') of one of the memory blocks BLK1 to BLKz shown in FIG. 2, (e.g., first memory block BLK1).

Referring to FIG. 4, a first memory block BLK1' may include a plurality of cell strings CS11' to CS1m' and CS21' to CS2m'. Each of the cell strings CS11' to CS1m' and CS21' to CS2m' may include the source selection transistor SST, the first to n-th memory cells MC1 to MCn and the drain selection transistor DST.

Each of the cell strings CS11' to CS1m' and CS21' to CS2m' may be formed into a 'U' shape.

A source of the source selection transistor SST of each cell string may be coupled to the common source line CSL, and a gate thereof may be coupled to the local source selection line LSSL.

The first to n-th memory cells MC1 to MCn of each cell string may be divided into first to p-th memory cells MC1 to MCp and p+1-th to n-th memory cells MCp+1 to MCn. The first to p-th memory cells MC1 to MCp may be arranged in a reverse direction to the +Z direction and coupled in series between the source selection transistor SST and a pipe transistor PT. The p+1-th to n-th memory cells MCp+1 to MCn may be sequentially arranged in the +Z direction and coupled in series between the pipe transistor PT and the drain selection transistor DST.

Memory cells having the same height may be coupled to the same word line. A gate of the first memory cell MC1 of each cell string may be coupled to the first local word line LWL1. A gate of the second memory cell MC2 of each cell string may be coupled to the second local word line LWL2. A gate of the p-th memory cell MCp of each cell string may be coupled to the p-th local word line LWLp. A gate of the p+1-th memory cell MCp+1 of each cell string may be coupled to a p+1-th local word line LWLp+1. A gate of an n−1-th memory cell MCn−1 of each cell string may be coupled to an n−1-th local word line LWLn−1. A gate of the n-th memory cell MCn of each cell string may be coupled to the n-th local word line LWLn.

The pipe transistor PT of each cell string may couple the first to p-th memory cells MC1 to MCp and the p+1-th to n-th memory cells MCp+1 to MCn to each other. A gate of the pipe transistor PT of each cell string may be coupled to a local pipe selection line LPL. In another example, gates of the pipe transistors PT of the cell strings arranged in the same row, i.e., in the +X direction may be coupled to the same local pipe selection line, while the gates of the pipe transistors PT of the cell strings arranged in different rows may be coupled to different local pipe selection lines.

The gates of the pipe transistors PT of the cell strings arranged in the same row may be coupled to the same local drain selection line. The gate of the drain selection transistor DST, included in each of the cell strings CS11' to CS1m', may be coupled to the first local drain selection line LDSL1. The gate of the drain selection transistor DST, included in each of the cell strings CS21' to CS2m', may be coupled to the second local drain selection line LDSL2.

As a result, the memory block BLK1, shown in FIG. 3, and the memory block BLK1', shown in FIG. 4, may have similar equivalent circuits except that the pipe selection transistor PT is included in each cell string.

Figure 5:
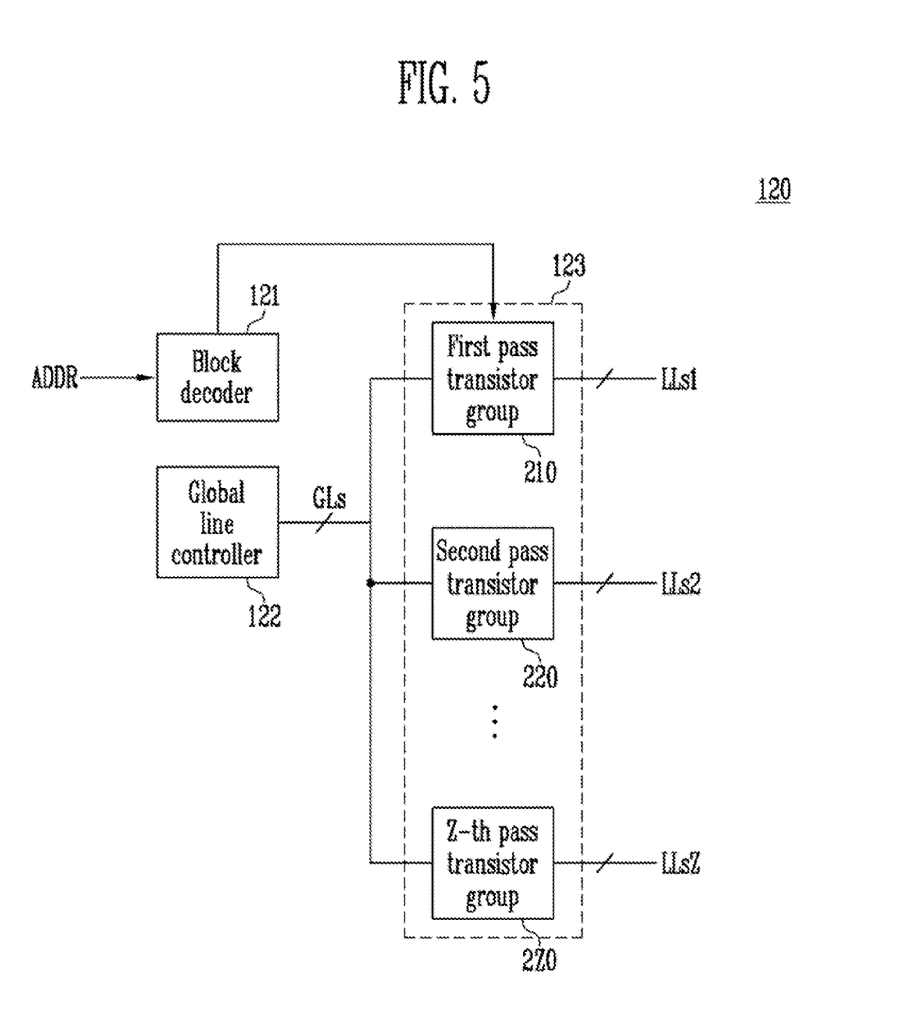
FIG. 5 is a detailed block diagram illustrating an address decoder shown in FIG. 1.

FIG. 5 is a detailed block diagram illustrating the address decoder 120 shown in FIG. 1.

Referring to FIG. 5, the address decoder 120 may include a block decoder 121, a global line controller 122, and a pass transistor circuit 123.

The block decoder 121 may receive the addresses ADDR. During an erase operation, the addresses ADDR may include a block address. The block decoder 121 may select one of first to z-th pass transistor groups 210 to 2z0 in response to the block address. For example, the block decoder 121 may be coupled to the first to z-th pass transistor groups 210 to 2z0 through a plurality of block word lines, and activate one of the plurality of block word lines in response to the addresses ADDR.

The global line controller 122 may be coupled to the first to z-th pass transistor groups 210 to 2z0 through global lines GLs. The global line controller 122 may apply voltages, provided from the voltage generator 130, to the global lines GLs in response to control of the control logic 150, shown in FIG. 1.

The pass transistor circuit 123 may include the first to Z-th pass transistor groups 210 to 2Z0. Each of the first to Z-th pass transistor groups 210 to 2Z0 may include a plurality of pass transistors. The first pass transistor group 210 to the Z-th pass transistor group 2Z0 may be coupled to first local lines LLs1 to Z-th local lines LLsZ, respectively. The first pass transistor group 210 may be coupled between the global lines GLs and the first local lines LLs1. The second pass transistor group 220 may be coupled between the global lines GLs and the second local lines LLs2. The Z-th pass transistor group 2Z0 may be coupled between the global lines GLs and the Z-th local lines LLsZ. A pass transistor group, selected by the block decoder 121 from among the first to z-th pass transistor groups 210 to 2Z0, may be electrically coupled to the global lines GLs and corresponding local lines.

Figure 6:
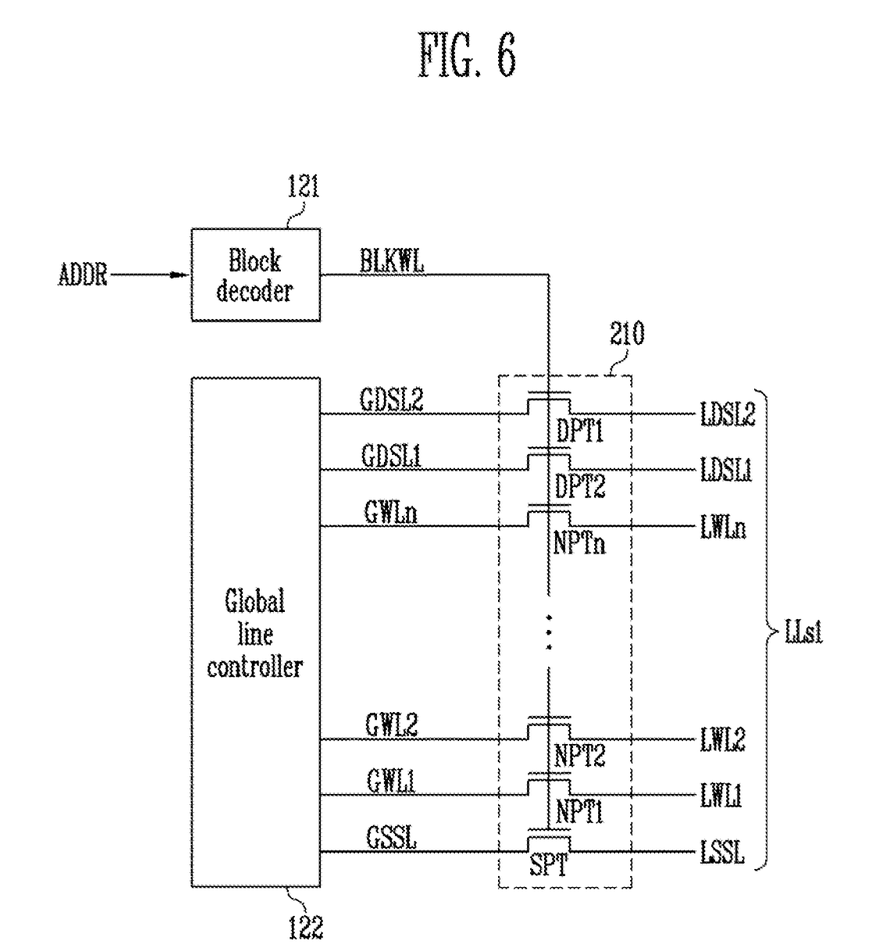
FIG. 6 is a view illustrating the relationship between a block decoder, a global line controller, and one of pass transistor groups shown in FIG. 5.

FIG. 6 is a view illustrating the relationship between the block decoder 121, the global line controller 122, and one (210) of the pass transistor groups 210 to 2z0 shown in FIG. 5.

Referring to FIG. 6, the first pass transistor group 210 may be coupled to the local source selection line LSSL, local word lines LWL1 to LWLn and local drain selection lines LDSL1 and LDSL2. The local source selection line LSSL, the local word lines LWL1 to LWLn and the local drain selection lines LDSL1 and LDSL2 may form the first local lines LLs1. The local source selection line LSSL, the local word lines LWL1 to LWLn and the local drain selection lines LDSL1 and LDSL2 may be coupled to the first memory blocks BLK1 and BLK1' as described above with reference to FIGS. 3 and 4, respectively.

The first pass transistor group 210 may include a source pass transistor SPT, first to n-th normal pass transistors NPT1 to NPTn and first and second drain pass transistors DPT1 and DPT2.

The source pass transistor SPT may be coupled between a global source selection line GSSL and the local source selection line LSSL. The first to n-th normal pass transistors NPT1 to NPTn may be coupled between first to n-th global word lines GWL1 to GWLn and the local word line LWL1 to LWLn, respectively. The first and second drain pass transistors DPT1 and DPT2 may be coupled between the first and second global drain selection lines GDSL1 and GDSL2, and the first and second local drain selection lines LDSL1 and LDSL2, respectively.

The block decoder 121 may be coupled in common to gates of the source pass transistor SPT, the first to n-th normal pass transistors NPT1 to NPTn, and the first and second drain pass transistors DPT1 and DPT2 through a block word line BLKWL. During an erase operation, the block decoder 121 may receive voltages from the voltage generator 130 and transfer the voltages to the block word line BLKWL.

The global line controller 122 may be coupled to the global source selection line GSSL, the first to n-th global word lines GWL1 to GWLn, and the first and second global drain selection lines GDSL1 and GDSL2. The global source selection line GSSL, the first to n-th global word lines GWL1 to GWLn, and the first and second global drain selection lines GDSL1 and GDSL2 may form the global lines GLs described above with reference to FIG. 5. During an erase operation, the global line controller 122 may receive voltages from the voltage generator 130 and transfer the voltages to the global lines GLs in response to control of the control logic 150.

According to an embodiment of the present invention, when the memory block BLK1 is configured as the embodiment (BLK1') described above with reference to FIG. 5, a global pipe selection line coupled to the global line controller 122 may be further provided, and the first pass transistor group 210 may further include a pipe pass transistor coupled between the local pipe line LPL, shown in FIG. 4, and the global pipe selection line.

Figure 7:
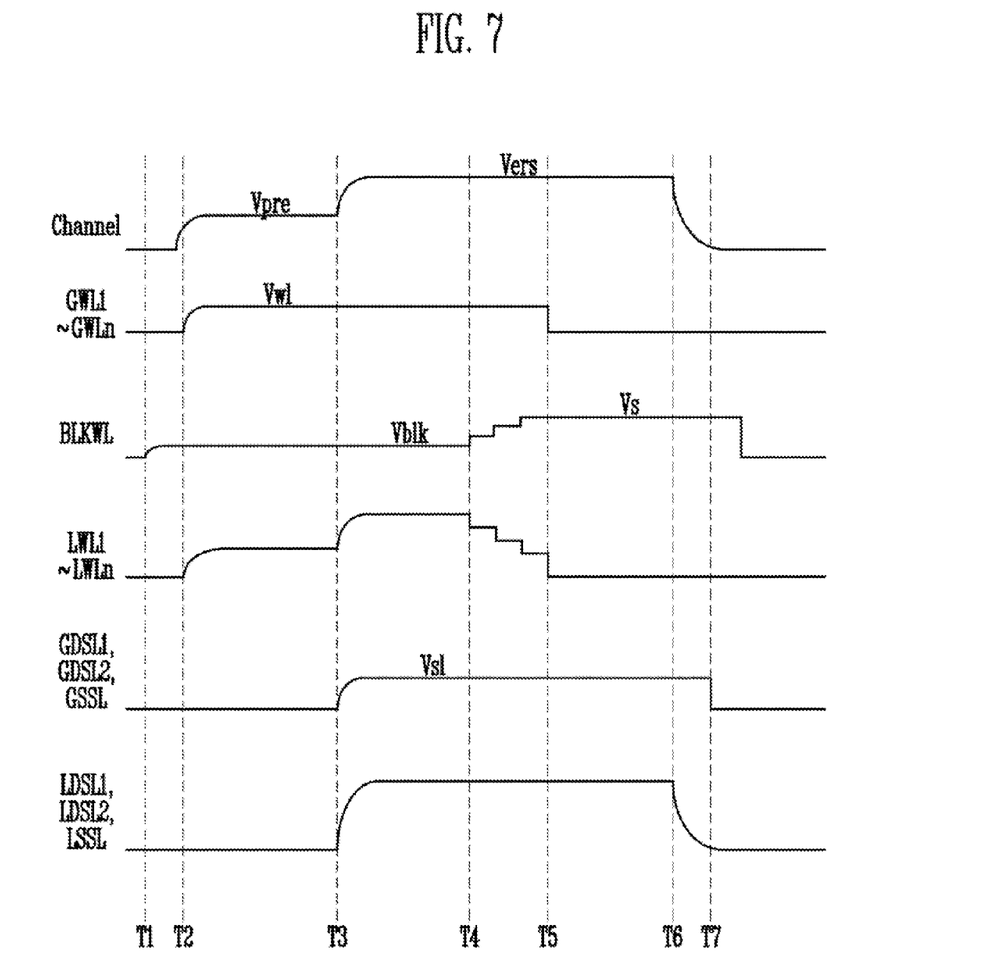
FIG. 7 is a timing diagram illustrating voltages applied to a selected memory block during an erase operation.

FIG. 7 is a timing diagram illustrating voltages applied to the selected memory block BLK1 during an erase operation.

Referring to FIGS. 6 and 7, a block word line voltage Vblk may be applied to the block word line BLKWL at a first time T1.

At a second time T2, a pre-voltage Vpre having a high voltage level may be transferred to a channel of the memory cells of the cell strings CS11 to CS1m and CS21 to CS2m. For example, the pre-voltage Vpre, generated from the voltage generator 130, may pass through a bulk region of the memory block BLK1 and the common source line CSL and be transferred to the channel of the memory cells.

A word line voltage Vw1 may be applied to the global word lines GWL1 to GWLn. The word line voltage Vw1 may be transferred to the normal pass transistors NPT1 to NPTn through the global word lines GWL1 to GWLn, respectively. Gates of the normal pass transistors NPT1 to NPTn may receive the block word line voltage Vblk through the block word line BLKWL. The word line voltage Vw1 may be higher than the block word line voltage Vblk. Each of the normal pass transistors NPT1 to NPTn may be turned on when a voltage, obtained by subtracting a voltage at a source thereof from a voltage at a gate thereof, is higher than a corresponding threshold voltage. Since the block word line voltage Vblk applied to the gate of each of the normal pass transistors NPT1 to NPTn is lower than the voltage (Vw1) applied to the source thereof, the normal pass transistors NPT1 to NPTn may be turned off. Therefore, the global word lines GWL1 to GWLn and the local word lines LWL1 to LWLn may be electrically separated from each other, and the local word lines LWL1 to LWLn may be floated. Voltages of the local word lines LWL1 to LWLn may be boosted by the pre-voltage Vpre applied to the channel of the memory cells.

At a third time T3, an erase voltage Vers that is higher than the pre-voltage Vpre may be applied to the channel of the memory cells of the cell strings CS11 to CS1m and CS21 to CS2m. Since the local word lines LWL1 to LWLn are floated, the voltages of the local word lines LWL1 to LWLn may be further increased.

A selection line voltage Vs1 may be applied to the global drain selection lines GDSL1 and GDSL2 and the global source selection line GSSL. The selection line voltage Vs1 may be higher than a voltage obtained by a threshold voltage of the pass transistor from the block word line voltage Vblk. For example, the selection line voltage Vs1 may be set to be higher than the block word line voltage Vblk. The drain pass transistors DPT1 and DPT2 and the source pass transistor SPT may be turned off since a voltage, obtained by subtracting a source voltage thereof from a gate voltage thereof, is lower than a corresponding threshold voltage. As a result, the local drain selection lines LDSL1 and LDSL2 and the local source selection line LSSL may be floated, and voltages of the local drain selection lines LDSL1 and LDSL2 and the local source selection line LSSL may be boosted by the erase voltage Vers applied to the channel of the memory cells.

At a fourth time T4, a voltage of the block word line BLKWL may gradually increase to a predetermined voltage Vs. The block decoder 121, shown in FIG. 6, may increase the voltage of the block word line BLKWL stepwise in response to the control logic 150. For example, the predetermined voltage Vs may be greater than a sum of the word line voltage Vw1 and a threshold voltage of the normal pass transistor.

A voltage applied to the gates of the normal pass transistors NPT1 to NPTn may gradually increase from the block word line voltage Vblk. As a result, the voltage, obtained by subtracting the voltage (Vw1), which is applied to the source of each of the normal pass transistors, from the voltage, which is applied to the gate of each of the normal pass transistors, may gradually decrease. Therefore, the amount of current flowing between the global word lines GWL1 to GWLn and the local word lines LWL1 to LWLn may gradually increase, and the boosted voltages of the local word lines LWL1 to LWLn may gradually decrease.

A voltage, obtained by subtracting the word line voltage Vw1 from the predetermined voltage Vs, may be higher than the threshold voltage of the normal pass transistor. That is, when the voltage of the block word line BLKWL increases to the predetermined voltage Vs, the normal pass transistor may be completely turned on, and the global word lines GWL1 to GWLn and the local word lines LWL1 to LWLn may be electrically coupled to each other.

The selection line voltage Vs1 may be set to be higher than the predetermined voltage Vs. That is, the predetermined voltage Vs, which is applied to gates of the drain pass transistors DPT1 and DPT2 and the source pass transistor SPT, may be lower than the voltage (Vs1) applied to sources thereof. The local drain selection lines LDSL1 and LDSL2 and the local source selection line LSSL may still be floated.

At a fifth time T5, when the voltage of the block word line BLKWL reaches the predetermined voltage Vs, a ground voltage may be applied to the global word lines GWL1 to GWLn. Therefore, the ground voltage may be transferred to the local word lines LWL1 to LWLn through the global word lines GWL1 to GWLn.

Data stored in the memory cells of the cell strings CS11 to CS1$m$ and CS21 to CS2$m$ may be erased due to the difference between the erase voltage Vers and the voltage transferred to the local word lines LWL1 to LWLn.

Unlike embodiments according to the present invention, when the voltage of the global word lines GWL1 to GWLn drastically changes from the word line voltage Vw1 to the ground voltage without gradually increasing the block word line voltage Vblk, the normal pass transistors NPT1 to NPTn may be turned on by the difference between the block word line voltage Vblk applied to the gates thereof and the ground voltage applied to the sources thereof. Therefore, the voltages of the local word lines LWL1 to LWLn may drastically change from a high voltage to the ground voltage. When the voltages of the local word lines LWL1 to LWLn drastically change in each erase operation, an electric field between the local word lines LWL1 to LWLn and the channel may drastically change, and a memory cell may be quickly degraded due to electrical overstress, for example, a tunnel oxide of the memory cell.

According to an embodiment of the present invention, the ground voltage may be applied to the global word lines GWL1 to GWLn after the difference in voltage between the block word line BLKWL and the global word lines GWL1 to GWLn is reduced. Therefore, the voltages of the local word lines LWL1 to LWLn may gradually decrease. Therefore, degradation of the memory cell may be prevented.

At a sixth time T6, the erase voltage Vers may be blocked, and the voltage of the channel of the memory cells may be reduced. Therefore, the voltages of the local drain selection lines LDSL1 and LDSL2 and the local source selection line LSSL, which are in a floating state, may also be reduced.

At a seventh time T7, voltages of the global drain selection lines GDSL1 and GDSL2 and the global source selection line GSSL may be changed to the ground voltage, and subsequently, the voltage of the block word line BLKWL may also be changed to the ground voltage.

According to an embodiment of the present invention, when the memory block BLK1 is configured as the embodiment (BLK1') described above with reference to FIG. 4, the global pipe line may also be controlled in substantially the same manner as the global drain selection lines GDSL1 and GDSL2 and the global source selection line GSSL. As a result, a voltage of the local pipe line LPL, shown in FIG. 4, may be described in substantially the same manner as the local drain selection lines LDSL1 and LDSL2 and the local source selection line LSSL shown in FIG. 7.

Figure 8:
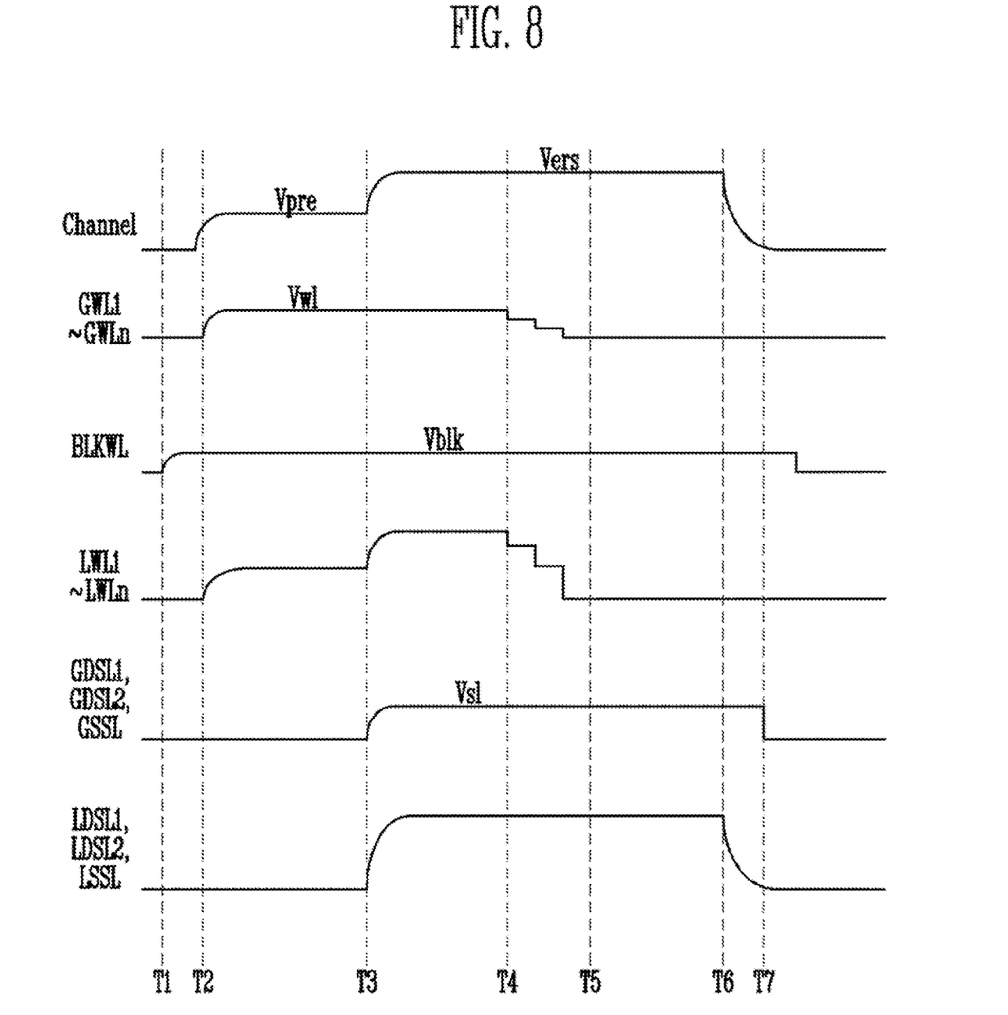
FIG. 8 is a timing diagram illustrating another embodiment of the voltages applied to the memory block on which the erase operation is performed.

FIG. 8 is a timing diagram illustrating another embodiment of voltages applied to a memory block on which an erase operation is performed.

FIG. 8 may be described in substantially the same manner as FIG. 7 except for an interval between the fourth time T4 and the fifth time T5. Hereinafter, a description of common contents with the earlier described timing diagram is omitted.

At the fourth time T4, the word line voltage Vw1 being applied to the global word lines GWL1 to GWLn may gradually decrease. For example, the global line controller 122, shown in FIG. 6, may decrease the voltage of the global word lines GWL1 to GWLn stepwise in response to the control logic 150. The voltage of the block word line BLKWL may be maintained at the block word line voltage Vblk.

The voltage, obtained by subtracting the voltage being applied to the sources of the normal pass transistors NPT1 to NPTn from the block word line voltage Vblk applied to the gates of the normal pass transistors NPT1 to NPTn, may gradually decrease. As a result, the amount of current flowing between the global word lines GWL1 to GWLn and the local word lines LWL1 to LWLn may gradually increase, thus the boosted voltages of the local word lines LWL1 to LWLn may gradually decrease.

Additionally, when voltages of the global word lines GWL1 to GWLn reach the ground voltage, the voltages of the local word lines LWL1 to LWLn may have the ground voltage.

According to an embodiment of the present invention, the difference in voltage between the block word line BLKWL and the global word lines GWL1 to GWLn may be reduced by gradually reducing the word line voltage Vw1 being applied to the global word lines GWL1 to GWL.

Figure 9:
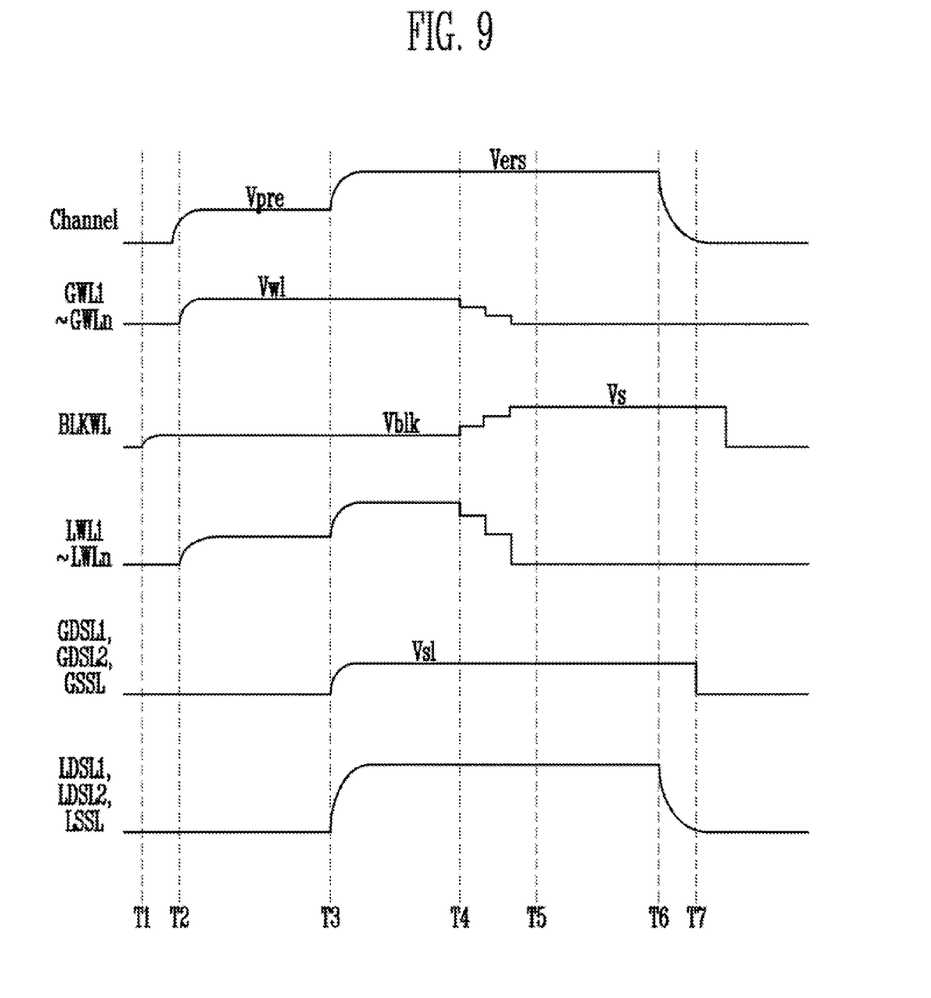
FIG. 9 is a timing diagram illustrating yet another embodiment of the voltages applied to the memory block on which the erase operation is performed.

FIG. 9 is a timing diagram illustrating yet another embodiment according to the present invention of the voltages applied to the memory block on which the erase operation is performed.

FIG. 9 may be described in substantially the same manner as FIG. 7 except for an interval between the fourth time T4 and the fifth time T5. Hereinafter, a description of common contents with earlier described timing diagrams is omitted.

At the fourth time T4, the word line voltage Vw1 being applied to the global word lines GWL1 to GWLn may gradually decrease. The voltage of the block word line BLKWL may gradually increase from the block word line voltage Vblk to the predetermined voltage Vs.

Therefore, the voltage, obtained by subtracting the voltage applied to the sources of the normal pass transistors NPT1 to NPTn through the global word lines GWL1 to GWLn from the voltage applied to the gates of the normal pass transistors NPT1 to NPTn through the block word line BLKWL, may gradually decrease. Therefore, the amount of current flowing through the global word lines GWL1 to GWLn and the local word lines LWL1 to LWLn may gradually increase, so that the boosted voltages of the local word lines LWL1 to LWLn may gradually decrease.

Additionally, when the voltages of the global word lines GWL1 to GWLn reach the ground voltage, the voltages of the local word lines LWL1 to LWLn may have the ground voltage.

According to an embodiment of the present invention, the difference in voltage between the block word line BLKWL and the global word lines GWL1 to GWLn may be reduced by gradually reducing the word line voltage Vw1 applied to the global word lines GWL1 to GWLn and gradually increasing the voltage applied to the block word line BLKWL.

Figure 10:
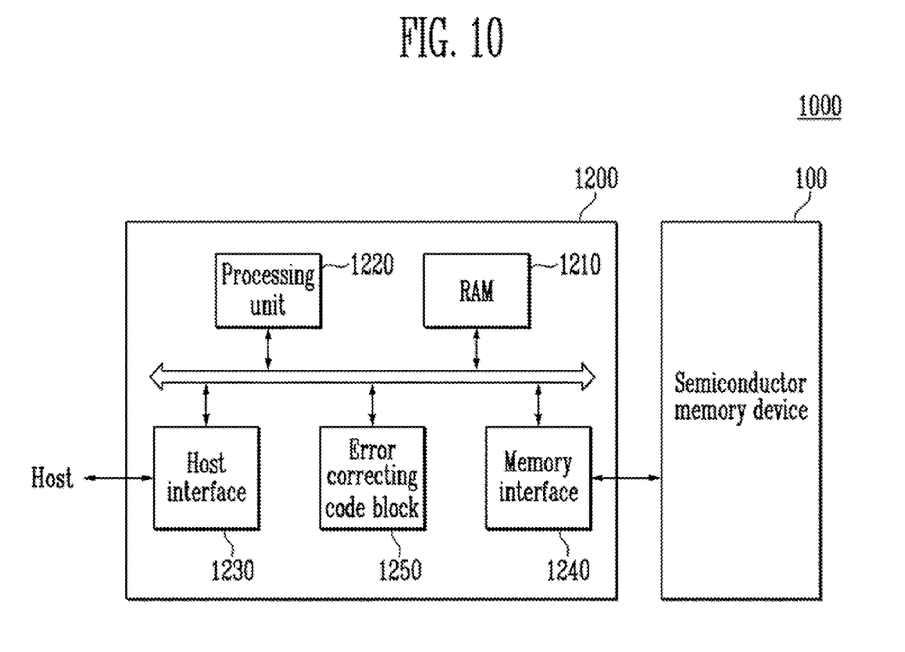
FIG. 10 is a block diagram illustrating a memory system including the semiconductor memory device shown in FIG. 1.

FIG. 10 is a block diagram illustrating a memory system 1000 including the semiconductor memory device 100 shown in FIG. 1.

Referring to FIG. 10, the memory system 1000 may include the semiconductor memory device 100 and a controller 1200.

The semiconductor memory device 100 may be configured and operated in substantially the same manner as described above with reference to FIGS. 1 to 9. Thus, a detailed description thereof will be omitted.

The controller 1200 may be coupled to a host and the semiconductor memory device 100. The controller 1200 may access the semiconductor memory device 100 in response to a request from the host. For example, the memory controller

1200 may control read, write, erase and background operations of the semiconductor memory device 100. The controller 1200 may provide an interface between the semiconductor memory device 100 and the host. The controller 1200 may drive firmware for controlling the semiconductor memory device 100.

The controller 1200 may include random access memory (RAM) 1210, a processing unit 1220, a host interface 1230, a memory interface 1240 and an error correcting code block 1250. The RAM 1210 may function as at least one of an operation memory of the processing unit 1220, a cache memory between the memory device 200 and the host, and a buffer memory between the semiconductor memory device 100 and the host. The processing unit 1220 may control the general operation of the controller 1200.

The host interface 1230 may include a protocol for data exchange between the host and the controller 1200. According to an exemplary embodiment, the controller 1200 may communicate with the host through one of various interface protocols including a Universal Serial Bus (USB) protocol, a multimedia card (MMC) protocol, a peripheral component interconnection (PCI) protocol, a PCI-express (PCI-E) protocol, an Advanced Technology Attachment (ATA) protocol, a Serial-ATA protocol, a Parallel-ATA protocol, a small computer small interface (SCSI) protocol, an enhanced small disk interface (ESDI) protocol, an Integrated Drive Electronics (IDE) protocol and a private protocol.

The memory interface 1240 may include a protocol for communication with the semiconductor memory device 100. For example, the memory interface 1240 may include at least one of flash interfaces, such as a NAND interface and a NOR interface.

The ECC block 1250 may detect an error in data from the semiconductor memory device 100 by using an error correcting code (ECC).

The controller 1200 and the semiconductor memory device 100 may be integrated into a single semiconductor device. In an exemplary embodiment, the controller 1200 and the semiconductor memory device 100 may be integrated into a single semiconductor device to form a memory card. For example, the controller 1200 and the semiconductor memory device 100 may be integrated into a single semiconductor device to form a PC card (personal computer memory card international association (PCMCIA)), a compact flash (CF) card, a smart media card (SM or SMC), a memory stick, a multimedia card (MMC, RS-MMC or MMCmicro), an SD card (SD, miniSD, microSD or SDHC), or universal flash storage (UFS).

The controller 1200 and the semiconductor memory device 100 may be integrated into a single semiconductor device to form a semiconductor drive (Solid State Drive (SSD)). The semiconductor drive (SSD) may include a storage device configured to store data in a semiconductor memory. When the memory system 1000 is used as the semiconductor drive (SSD), an operating speed of the host coupled to the memory system 1000 may be significantly improved.

In another example, the memory system 1000 may be used as one of various components of an electronic device, such as a computer, an ultra mobile PC (UMPC), a workstation, a net-book, personal digital assistants (PDAs), a portable computer, a web tablet, a wireless phone, a mobile phone, a smart phone, an e-book, a portable multimedia player (PMP), a portable game machine, a navigation device, a black box, a digital camera, a three-dimensional (3D) television, a digital audio recorder, a digital audio player, a digital picture recorder, a digital picture player, a digital video recorder, a digital video player, a device for transmitting/receiving information in wireless environment, one of various electronic devices for home networks, one of various electronic devices for computer networks, one of various electronic devices for telematics networks, an RFID device and/or one of various devices for computing systems, etc.

In an exemplary embodiment, the semiconductor memory device 100 or the memory system 1000 may be packaged in a variety of ways. For example, in some embodiments, the semiconductor memory device 100 or the memory system 1000 may be packaged using various methods such as a package on package (PoP), ball grid arrays (BGAs), chip scale packages (CSPs), a plastic leaded chip carrier (PLCC), a plastic dual in line package (PDIP), a die in waffle pack, a die in wafer form, a chip on board (COB), a ceramic dual in line package (CERDIP), a plastic metric quad flat pack (MQFP), a thin quad flatpack (TQFP), a small outline (SOIC), a shrink small outline package (SSOP), a thin small outline (TSOP), a thin quad flatpack (TQFP), a system in package (SIP), a multi chip package (MCP), a wafer-level fabricated package (WFP) and/or a wafer-level processed stack package (WSP), etc.

Figure 11:
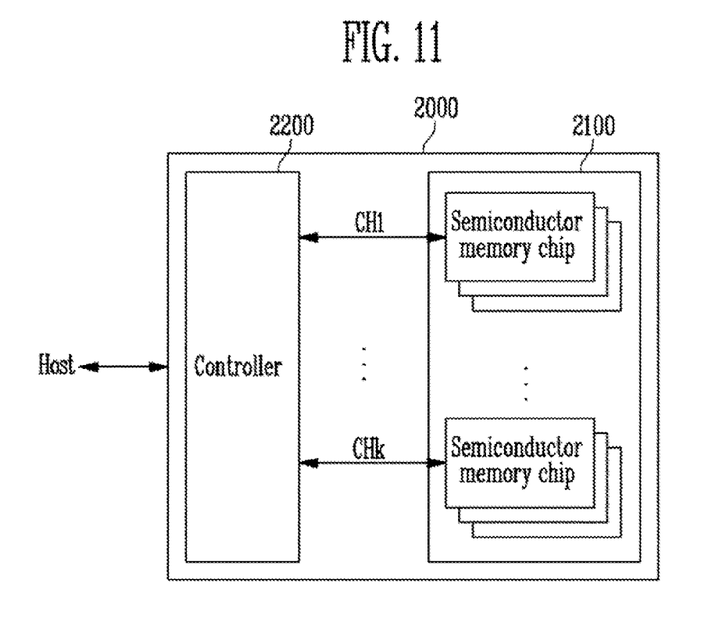
FIG. 11 is a block diagram illustrating an application example of the memory system shown in FIG. 10.

FIG. 11 is a block diagram illustrating an application example (2000) an of the memory system shown in FIG. 15.

Referring to FIG. 11, a memory system 2000 may include the semiconductor memory device 2100 and the controller 2200. The semiconductor memory device 2100 may include a plurality of semiconductor memory chips. The semiconductor memory chips may be divided into a plurality of groups.

FIG. 11 illustrates the plurality of groups communicating with the controller 220 through first to k-th channels CH1 to CHk, respectively. Each of the memory chips may be configured and operated in substantially the same manner as the semiconductor memory device 100 described above with reference 1.

Each of the groups may communicate with the controller 2200 through a single common channel. The controller 2200 may be configured in substantially the same manner as the controller 1200 as described above with reference to FIG. 15 and may control the plurality of memory chips of the semiconductor memory device 2100.

FIG. 11 illustrates the plurality of semiconductor memory chips coupled to a single channel. However, the memory system 2000 may be modified so that a single semiconductor memory chip may be coupled to a single channel.

Figure 12:
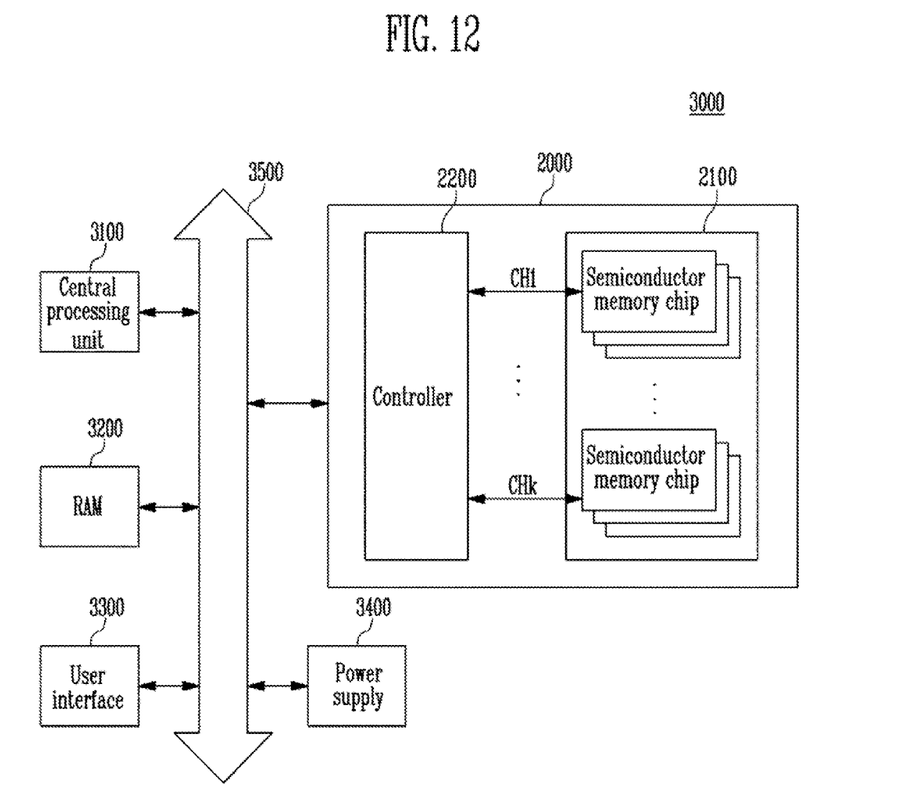
FIG. 12 is a block diagram illustrating a computing system including the memory system described with reference to FIG. 11.

FIG. 12 is a block diagram illustrating a computing system 3000 including the memory system 2000 shown in FIG. 11.

Referring to FIG. 12, the computing system 3000 may include a central processing unit 3100, random access memory (RAM) 3200, a user interface 3300, a power supply 3400, a system bus 3500, and the memory system 2000.

The memory system 2000 may be electrically coupled to the central processing unit 3100, the RAM 3200, the user interface 3300 and the power supply 3400 through the system bus 3500. Data provided through the user interface 3300 or processed by the central processing unit 3100 may be stored in the memory system 2000.

FIG. 12 illustrates the semiconductor memory device 2100 coupled to the system bus 3500 through the controller 2200. However, the semiconductor memory device 2100 may be directly coupled to the system bus 3500. Functions of the controller 2200 may be performed by the central processing unit 3100 and the RAM 3200.

FIG. 12 illustrates the memory system 2000 described above with reference to FIG. 11. However, the memory system 2000 may be replaced by the memory system 1000 described above with reference to FIG. 10. In an exemplary embodiment, the computing system 3000 may include both memory systems 1000 and 2000 described above with reference to FIGS. 10 and 11, respectively.

As described within according to embodiments of the present invention, after the difference in voltage between the block word line BLKWL and the global word lines GWL1 to GWLn gradually decreases, a ground voltage may be applied to the global word lines GWL1 to GWLn. As a result, the voltages of the global word lines GWL1 to GWLn may gradually decrease. Accordingly, degradation of a memory cell may be prevented.

According to embodiments of the present invention, a semiconductor memory device preventing degradation of a memory cell and an erasing method thereof are provided.

While the present invention has been described with respect to the specific embodiments, it will be apparent to those skilled in the art that various changes and modifications may be made without departing from the spirit and scope of the invention as defined in the following claims.

What is claimed is:

1. A semiconductor memory device, comprising:
a memory cell array having a plurality of memory cells;
a pass transistor group having normal pass transistors coupled between global word lines and local word lines to which the plurality of memory cells are coupled; and
an address decoder coupled to the global word lines and a block word line to which gates of the normal pass transistors are coupled in common,
wherein the address decoder gradually increases a voltage, obtained by subtracting a voltage of the global word lines from a voltage of the block word line, when an erase voltage is provided to a channel of the plurality of memory cells.

2. The semiconductor memory device of claim 1, wherein the address decoder gradually increases the voltage of the block word line when the erase voltage is provided to the channel of the plurality of memory cells.

3. The semiconductor memory device of claim 2, wherein the address decoder applies a ground voltage to the global word lines when the voltage of the block word line gradually increases to a first voltage level.

4. The semiconductor memory device of claim 3, wherein the memory cell array further includes drain selection transistors and source selection transistors, and
a predetermined number of the memory cells are coupled between the drain selection transistors and the source selection transistors.

5. The semiconductor memory device of claim 4, wherein the pass transistor group further includes:
a drain pass transistor coupled between a local drain selection line, coupled to the drain selection transistors, and a global drain selection line; and
a source pass transistor coupled between a local source selection line, coupled to the source selection transistors, and a global source selection line,
wherein a gate of the drain pass transistor and a gate of the source pass transistor are coupled in common to the block word line,
wherein the address decoder is coupled to the drain pass transistor and the source pass transistor through the global drain selection line and the global source selection line, respectively.

6. The semiconductor memory device of claim 5, wherein the address decoder applies a voltage having a higher voltage level than the first voltage level to the global drain selection line and the global source selection line.

7. The semiconductor memory device of claim 3, wherein the plurality of memory cells are divided into first memory cells coupled in series and second memory cells coupled in series, and
the memory cell array further includes a pipe transistor arranged between the first memory cells and the second memory cells.

8. The semiconductor memory device of claim 7, wherein the pass transistor group further includes a pipe pass transistor coupled between a local pipe selection line, coupled to the pipe transistor, and a global pipe selection line,
wherein a gate of the pipe pass transistor is coupled to the block word line, and
the address decoder applies a voltage having a higher voltage level than the first voltage level to the global pipe selection line.

9. The semiconductor memory device of claim 1, wherein the address decoder gradually reduces the voltage of the global word lines when the erase voltage is provided to the channel of the plurality of memory cells.

10. The semiconductor memory device of claim 1, wherein the address decoder comprises:
a block decoder suitable for controlling the block word line; and
a row decoder suitable for controlling the global word lines.

11. An erasing method of a semiconductor memory device having a plurality of memory cells and normal pass transistors coupled between global word lines and local word lines to which the plurality of memory cells are coupled, the erasing method, comprising:
providing an erase voltage to a channel of the plurality of memory cells; and
gradually increasing a voltage, obtained by subtracting a voltage of the global word lines from a voltage of a block word line connected in common to gates of the normal pass transistors, while the erase voltage is provided; and
applying a ground voltage to the local word lines through the global word lines.

12. The erasing method of claim 11, wherein, in the gradually increasing of the voltage, the voltage of the block word line gradually increases and the voltage of the global word lines is maintained.

13. The erasing method of claim 12, wherein the ground voltage is applied to the global word lines when the voltage of the block word line gradually increases to a first voltage level.

14. The erasing method of claim 11, wherein the providing of the erase voltage comprises floating the local word lines to increase a voltage of the local word lines according to the erase voltage.

15. The erasing method of claim 11, wherein, in the gradually increasing of the voltage, the voltage of the block word line is maintained, and the voltage of the global word lines is gradually reduced.

16. The erasing method of claim 11, wherein, in the gradually increasing of the voltage, the voltage of the block word line gradually increases, and the voltage of the global word lines gradually decreases.

17. A semiconductor memory device, comprising:
a memory cell array having a plurality of memory cells;
local word lines coupled to the plurality of memory cells; and
an address decoder coupled to the local word lines,
wherein the address decoder floats the local word lines to increase a voltage of the local word lines by an erase voltage provided to a channel of the plurality of memory cells, and then gradually discharges the voltage of the local word lines.

18. The semiconductor memory device of claim 17, wherein the address decoder includes normal pass transistors coupled between global word lines and the local word lines, the address decoder is coupled to gates of the normal pass transistors through a block word line, and the address decoder gradually increases a voltage of the block word line to discharge the voltage of the local word lines to the global word lines.

19. The semiconductor memory device of claim 17, wherein the address decoder includes normal pass transistors coupled between the global word lines and the local word lines, and the address decoder gradually reduces a voltage of the global word lines to discharge the voltage of the local word lines to the global word lines.

\* \* \* \* \*